(12) United States Patent
Kamalanathan

(10) Patent No.: US 9,001,553 B1
(45) Date of Patent: Apr. 7, 2015

(54) RESISTIVE DEVICES AND METHODS OF OPERATION THEREOF

(71) Applicant: Adesto Technologies Corporation, Sunnyvale, CA (US)

(72) Inventor: Deepak Kamalanathan, Santa Clara, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 206 days.

(21) Appl. No.: 13/670,385

(22) Filed: Nov. 6, 2012

(51) Int. Cl.
*G11C 11/00* (2006.01)
(52) U.S. Cl.
CPC .................................. *G11C 11/4006* (2013.01)
(58) Field of Classification Search
USPC .............. 365/148, 163, 158, 185.18, 185.19, 365/185.2
See application file for complete search history.

(56) References Cited

U.S. PATENT DOCUMENTS

| | | | |
|---|---|---|---|
| 5,638,324 A * | 6/1997 | Sim ........................... | 365/185.22 |
| 6,650,153 B2 | 11/2003 | Zerilli et al. | |
| 7,292,469 B2 | 11/2007 | Lee et al. | |
| 7,319,615 B1 | 1/2008 | Park et al. | |
| 7,345,522 B2 | 3/2008 | Owen | |
| 7,372,716 B2 | 5/2008 | Roehr et al. | |
| 7,447,086 B2 | 11/2008 | Wan et al. | |
| 7,515,460 B2 * | 4/2009 | Gordon et al. ................. | 365/163 |
| 7,542,351 B2 | 6/2009 | Choy et al. | |
| 7,715,235 B2 | 5/2010 | Cernea | |
| 7,848,151 B2 | 12/2010 | Chan et al. | |
| 7,888,228 B2 | 2/2011 | Blanchard | |
| 7,974,122 B2 * | 7/2011 | Lin et al. ........................ | 365/163 |
| 8,274,812 B2 * | 9/2012 | Nazarian et al. .............. | 365/148 |
| 8,300,449 B2 * | 10/2012 | Lin et al. ........................ | 365/148 |
| 8,559,209 B2 * | 10/2013 | Siau ............................... | 365/148 |
| 2008/0217670 A1 | 9/2008 | Dahmani | |

OTHER PUBLICATIONS

Chen, A., "Status and Challenges in Ionic Memories," Strategic Technology Group, AMD, Nov. 12, 2008, 34 pages.
Hisashi, S., et al., "Basics of RRAM based on transition metal oxides," International Symposium on Advanced Gate Stack Technoloy, Sep. 29-Oct. 1, 2010, 25 pages.
Jo, S.H., "Nanoscale Memristive Devices for Memory and Logic Applications," Dissertation submitted in partial fulfillment of the requirements for the degree of Doctor Philosphy, University of Michigan, 2010, 153 pages.
Kamalanathan, D., "Kinetics of Programmable Metallization Cell Memory," A Dissertation Presented in Partial Fulfillment of the Requirements for the Degree Doctor of Philosophy, Arizona State University, May 2011, 140 pages.

(Continued)

*Primary Examiner* — Pho M Luu
(74) *Attorney, Agent, or Firm* — Slater & Matsil, L.L.P.

(57) ABSTRACT

A method of operating a resistive switching device includes applying a program stress to a two terminal resistive memory unit. The program stress is applied at a program voltage configured to change a state of the memory unit from a first state to a second state. The method further includes applying a verification/stabilization stress to the two terminal resistive memory unit. The verification/stabilization stress is applied at a verification/stabilization voltage. An erase stress is applied to the two terminal resistive memory unit. The erase stress is applied at an erase voltage configured to change a state of the memory unit from the second state to the first state. The verification/stabilization voltage is between the program voltage and the erase voltage.

26 Claims, 18 Drawing Sheets

(56) References Cited

OTHER PUBLICATIONS

Kozicki, M. N., et al., "Non-Volatile Memory Based on Solid Electrolytes," Non-Volatile Memory Technology Symposium, 2004, 8 pages.

Kozicki, M., "Programmable Metallization Cell: From Academic Research to a Market Place," Axon Technologies, 1 page, 1996.

Valov, I., et al., "Electrochemical Metallization memories-fundamentals, applications, prospects," Nanotechnology, 2011, 22 pages.

Wong, H.-S. P., "Emerging Memories," Center for Integrated Systems, Stanford University, Apr. 3, 2008, 77 pages.

Wong, H.-S. P., "Phase Change Memory," Proceedings of the IEEE, vol. 98, No. 12, Dec. 2010, pp. 2201-2227.

* cited by examiner

RESISTIVE DEVICES AND METHODS OF OPERATION THEREOF

TECHNICAL FIELD

The present invention relates generally to semiconductor devices, and in particular to resistive devices and methods of operation thereof.

BACKGROUND

Semiconductor industry relies on device scaling to deliver improved performance at lower costs. Flash memory is the mainstream non-volatile memory in today's market. However, Flash memory has a number of limitations that is posing a significant threat to continued advancement of memory technology. Therefore, the industry is exploring alternative memories to replace Flash memory. Contenders for future memory technology include magnetic storage random access memory (MRAM), ferroelectric RAM (FeRAM), and resistive switching memories such as phase change RAM (PCRAM), resistive RAM (RRAM), ionic memories including programmable metallization cell (PMC) or conductive bridging random access memory (CBRAM). These memories are also called as emerging memories.

To be viable, the emerging memory has to be better than Flash memory in more than one of technology metrics such as scalability, performance, energy efficiency, On/Off ratio, operational temperature, CMOS compatibility, and reliability.

SUMMARY OF THE INVENTION

In accordance with an embodiment of the present invention, a method of operating a resistive switching device comprises applying a program stress to a two terminal resistive memory unit. The program stress is applied at a program voltage configured to change a state of the memory unit from a first state to a second state. The method further includes applying a verification/stabilization stress to the two terminal resistive memory unit. The verification/stabilization stress is applied at a verification/stabilization voltage. An erase stress is applied to the two terminal resistive memory unit. The erase stress is applied at an erase voltage configured to change a state of the memory unit from the second state to the first state. The verification/stabilization voltage is between the program voltage and the erase voltage.

In accordance with an embodiment of the present invention, a method of operating a resistive switching device includes applying a program stress to a two terminal resistive memory unit. The program stress is applied at a program voltage configured to change a state of the memory unit from a first state to a second state. After applying the program stress, a read stress is applied to the two terminal resistive memory unit. The read stress is applied at a read voltage. After applying the read stress, a verification/stabilization stress is applied to the two terminal resistive memory unit. The verification/stabilization stress is applied at a verification/stabilization voltage. The verification/stabilization voltage is between the read voltage of the two terminal resistive memory unit and a erase voltage of the two terminal resistive memory unit.

In accordance with an embodiment of the present invention, a semiconductor device comprises a memory cell array comprising an array of two terminal resistive memory units, a program circuit configured to program the array of two terminal resistive memory units, and a verification/stabilization circuit configured to apply a verification/stabilization stress on a first memory unit of the memory cell array. The verification/stabilization stress is a voltage between a read voltage of a memory unit of the array of two terminal resistive memory units and a erase or a program voltage of a memory unit of the array of two terminal resistive memory units.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates cross-sectional view and operation of a conventional resistive switching memory, wherein FIG. 1A illustrates a cross-sectional view of a conventional ionic memory, wherein FIG. 1B illustrates the memory under a programming operation, and wherein FIG. 1C illustrates the memory under an erase operation;

FIG. 2, which includes

FIG. 3, which includes

FIG. 5, which includes FIGS. 5A-5D, illustrates a method of operating a memory cell in accordance with embodiments of the present invention, wherein FIGS. 5A and 5B illustrate a post program operation while FIG. 5C illustrates a pre-erase operation in accordance with embodiments of the invention, and wherein FIG. 5D illustrates a verification/stabilization operation without feedback;

FIG. 6, which includes

FIG. 7, which includes FIGS. 7A-7C, illustrates voltages used in operation of the memory unit, wherein FIG. 7A illustrates the relative positioning of the verification voltage while FIGS. 7B and 7C illustrate examples of the programming, verification, and erase pulses;

FIG. 8, which includes

FIG. 9, which includes

FIG. 10, which includes FIG. 11, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely ionic memories such as conductive bridging memories. The invention may also be applied, however, to other types of memories, particularly, to any resistive memory such as two terminal resistive memories. Although described herein for a memory device, the embodiments of the invention may also be applied to other types of devices formed by resistive switching such as processors, dynamically-reroutable electronics, optical switches, field-programmable gate arrays, and microfluidic valves as well as other nanoionic devices.

Figure 1A:
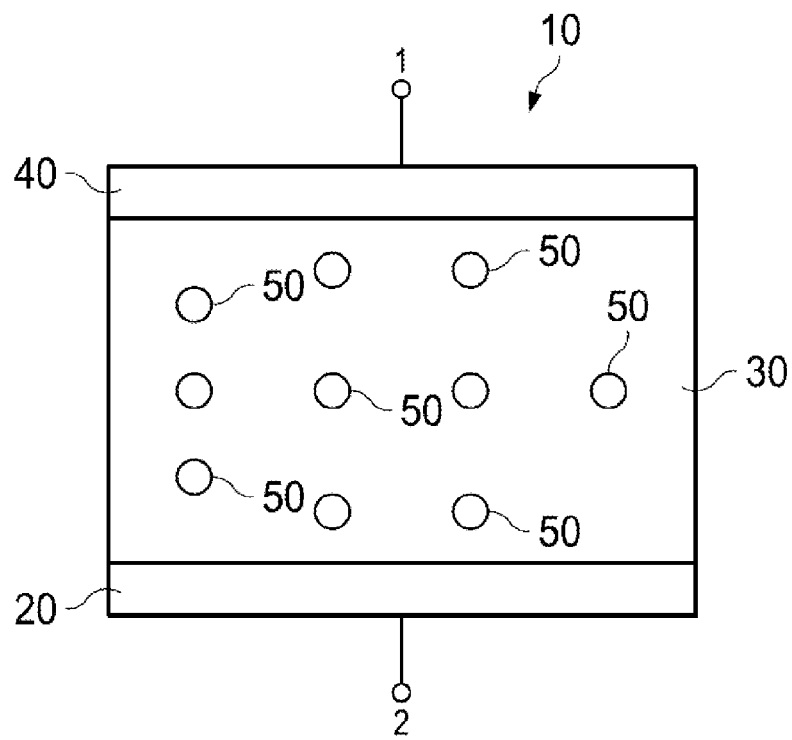
Figure 1B:
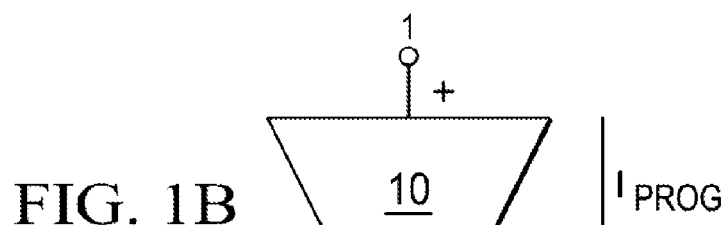
Figure 1C:
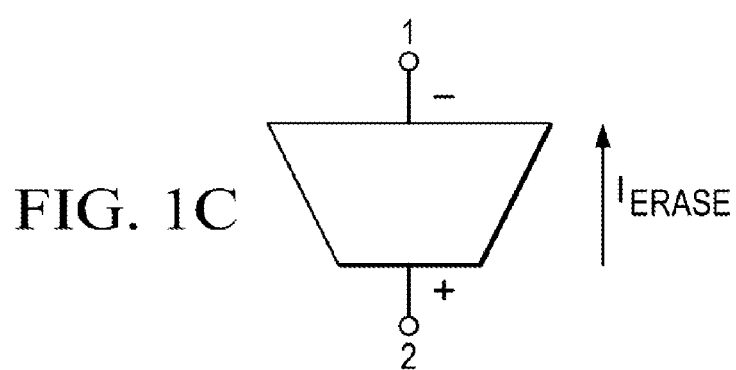

FIG. 1, which includes FIGS. 1A-1C, illustrates cross-sectional view and operation of a resistive switching memory, wherein FIG. 1A illustrates a cross-sectional view of a conventional ionic memory, wherein FIG. 1B illustrates the memory under a programming operation, and wherein FIG. 1C illustrates the memory under an erase operation.

FIG. 1A illustrates a memory unit 10 having a variable resistance layer 30 placed between a first conductive layer 20 and a second conductive layer 40. The variable resistance layer 30 may be a solid electrolyte layer that is programmable, for example, by the application of external stimuli such as electric potential, heat, magnetic field, and others. In other words, the resistance across the variable resistance layer 30 may be changed by the application of a program operation and a corresponding erase operation. For example, after a program operation, the variable resistance layer 30 has a low resistance (ON state) whereas after an erase operation, the variable resistance layer 30 has a high resistance (OFF state). The operation of the memory cell involves nano-scale migration and rearrangement of conductive atoms such as metal atoms through the variable resistance layer 30. Alternatively, the memory cell may operate due to the motion of defects such as point defects within the variable resistance layer 30. The program/erase operations may be performed by applying an electrical signal between a first node 1 and a second node 2.

As illustrated in FIG. 1A, nanophases 50 may be disbursed within the variable resistance layer 30. In some embodiments, the nanophases 50 may be conductive. However, the resistivity of this variable resistance layer 30 in the OFF state is high, for example, greater than 500 MΩ and depends on the cell area. The resistivity state of the memory cell can be read by applying a read voltage between the first and the second nodes 1 and 2. However, the read voltage does not change the state of the memory cell.

FIG. 1B illustrates the memory unit during a conventional program operation. The programming operation may be accomplished using a static voltage or a dynamic pulse. When a positive voltage is applied across the first and the second nodes 1 and 2 as illustrated in FIG. 1B, conductive atoms from the second conductive layer 40 may be oxidized forming conductive ions, which are then accelerated due to the electric field in the variable resistance layer 30. The programming pulse, e.g., depending on the variable resistance layer 30, may have a potential $V_{PROG}$ higher than the threshold voltage. The conductive ions drift towards the first conductive layer 20, which may be the cathode. Within the variable resistance layer 30, the conductive ions may migrate using nanophases 50, which may absorb a drifting conductive ion and release the same or another conductive ion. Eventually, a conductive ion close to the first conductive layer absorbs an electron from the second node 2 and is reduced back to a conductive atom. The reduced conductive atom is deposited over the first conductive layer 20. During the programming pulse, more and more conductive ions are brought from the second conductive layer 40 to the first conductive layer 20, which eventually results in the formation of a conductive filament within the variable resistance layer 30. The flow of the conductive ions also results in the flow of the programming current $I_{PROG}$ through the variable resistance layer 30. After the bridging of the first conductive layer 20 with the second conductive layer 40 through the variable resistance layer 30, the resistivity of the variable resistance layer 30 drops significantly and may be measured/read using a read operation.

FIG. 1C illustrates the memory unit during a conventional erase operation. The erase operation may be accomplished using a static voltage or a dynamic pulse. When a negative voltage is applied across the first and the second nodes 1 and 2 as illustrated in FIG. 1C, conductive atoms in the conductive filament formed previously get oxidized to conductive ions, which drift to the second conductive layer 40 due to the electric field. At the second conductive layer 40, these conductive ions absorb electrons from the first node 1 and are reduced to conductive atoms reforming the initial high resistivity state. The flow of the conductive ions towards the second conductive layer 40 results in the flow of the erase current $I_{ERASE}$ through the variable resistance layer 30. Unlike the second conductive layer 40, the first conductive layer 20 is inert and therefore does not contribute conductive atoms. Therefore, the erase process terminates upon the relocation of all the conductive atoms within the variable resistance layer 30. Programming and erase may be performed using a series of square/rectangular pulses.

Figure 2A:
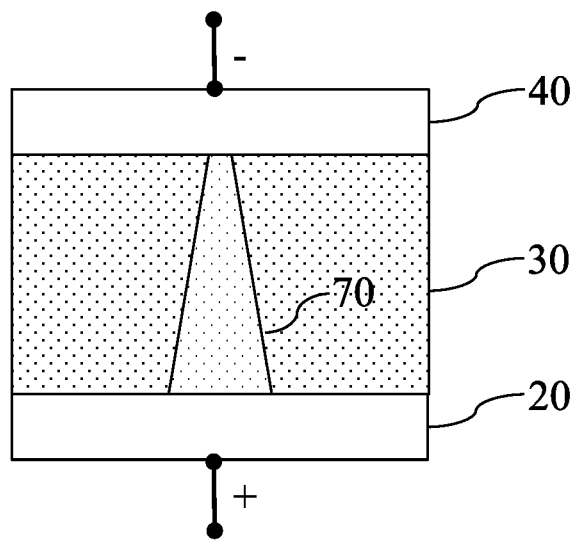
FIGS. 2A and 2B, illustrates a schematic of the memory unit during an ideal erasure process.
Figure 2B:
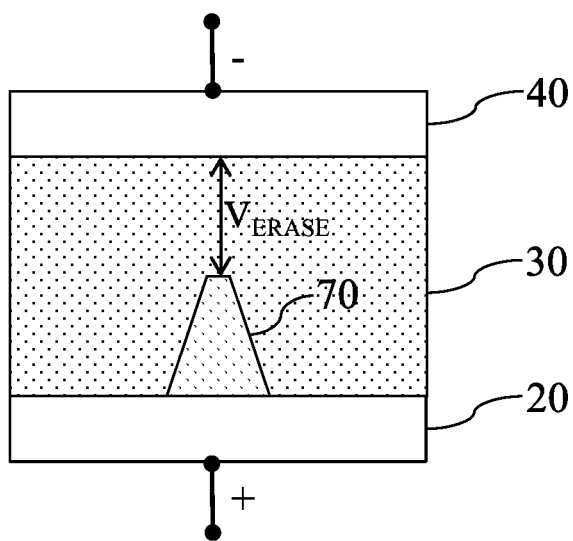

FIG. 2, which includes FIGS. 2A and 2B, illustrates a schematic of the memory unit during an ideal erasure process. FIG. 2 is illustrated for understanding purposes and actual physical mechanisms may be more complex.

As illustrated in FIG. 2A, prior to the erasure, the memory unit is in a low resistivity state and has a conductive path 70 formed within the variable resistance layer 30. When a negative voltage (erase pulse) is applied across the memory unit, conductive atoms within the variable resistance layer 30 are ionized. These ionized conductive atoms within the variable resistance layer 30 are attracted by the electric field into the second conductive layer 40 and are reduced back to conductive atoms there. In particular, as the resistivity of the conductive path 70 decreases towards the first conductive layer 20 (e.g., diameter of the conductive path 70 likely increases), the potential drop is maximum at the tip of the conductive path 70 adjacent the second conductive layer 40. Thus, the conductive path 70 begins to dissolve from the surface adjacent the second conductive layer 40.

As illustrated in FIG. 2B, much of the applied erase voltage $V_{ERASE}$ is dropped across the resistive portion of the variable resistance layer 30. Therefore, subsequent conductive atoms are dissolved from the top surface of the conductive path 70. Subsequently, all the conductive atoms in the conductive path 70 dissolve and are reabsorbed at the second conductive layer 40.

Figure 3A:
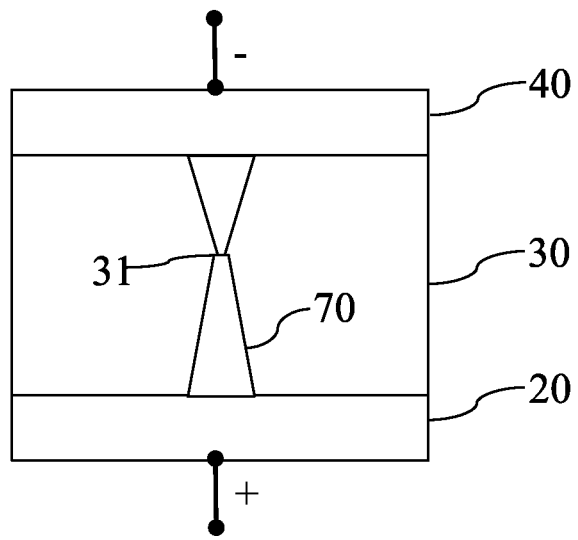
FIGS. 3A-3D, illustrates a schematic of the memory unit during an example non-ideal erasure process as identified by the inventors.
Figure 3C:
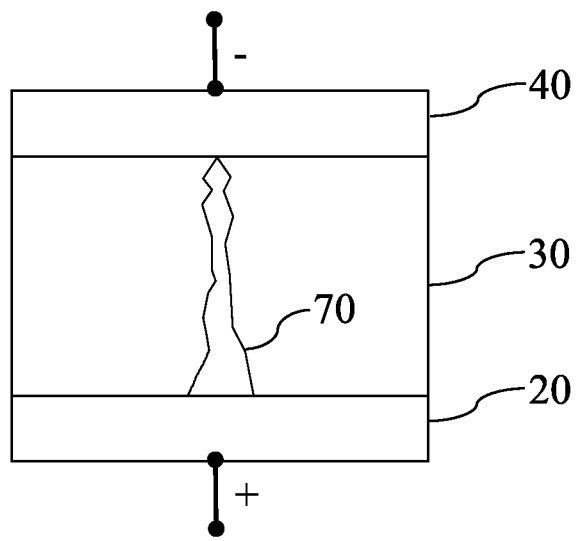
Figure 3B:
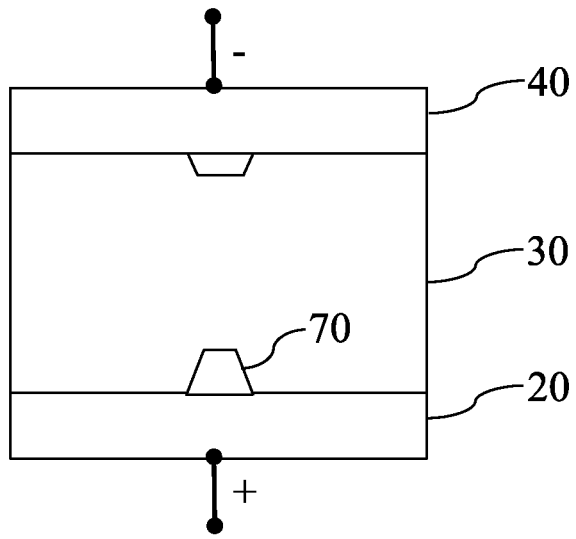

FIG. 3, which includes FIGS. 3A and 3B, illustrates a schematic of the memory unit during an example non-ideal erasure process as identified by the inventors. FIG. 3 is illustrated for understanding purposes and actual physical mechanisms may be more complex.

In contrast to an ideal erasure process illustrated in FIG. 2, due to various reasons, the erasure process may be non-ideal. For example, the conductive path 70 may break up from different points. As an example, as illustrated in FIG. 3A, the conductive path 70 may begin dissolving from an intermediate point.

This process will be further from the ideal erasure process illustrated in FIG. 2B because the conductive path 70 dissolves unpredictably. As next illustrated in FIG. 3B, the erasure process may be asymmetric. For example, the erase may start from the weakest link or neck 31 of the conductive path 70 in FIG. 3A.

Figure 3D:
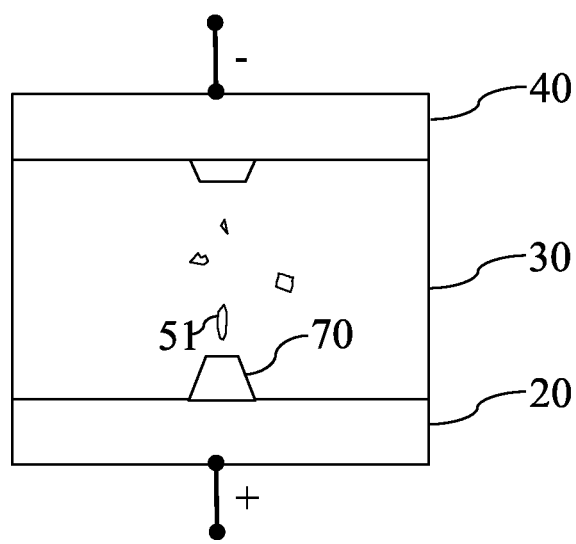

In another case illustrated in FIG. 3C, a large number of conductive atoms may dissolve simultaneously from the conductive path 70. Such a non-ideal dissolution may result in a defective structure in which the variable resistance layer 30 comprises defects 51 after the erase process as illustrated in FIG. 3D. These defects 51 may comprise clusters of conductive atoms or may be artifacts from the destructive nature of the erase process. When such a memory unit is erased during normal operation, the memory unit may result in poor erasure, which can negatively impact the reliability of the cell.

Figure 4:
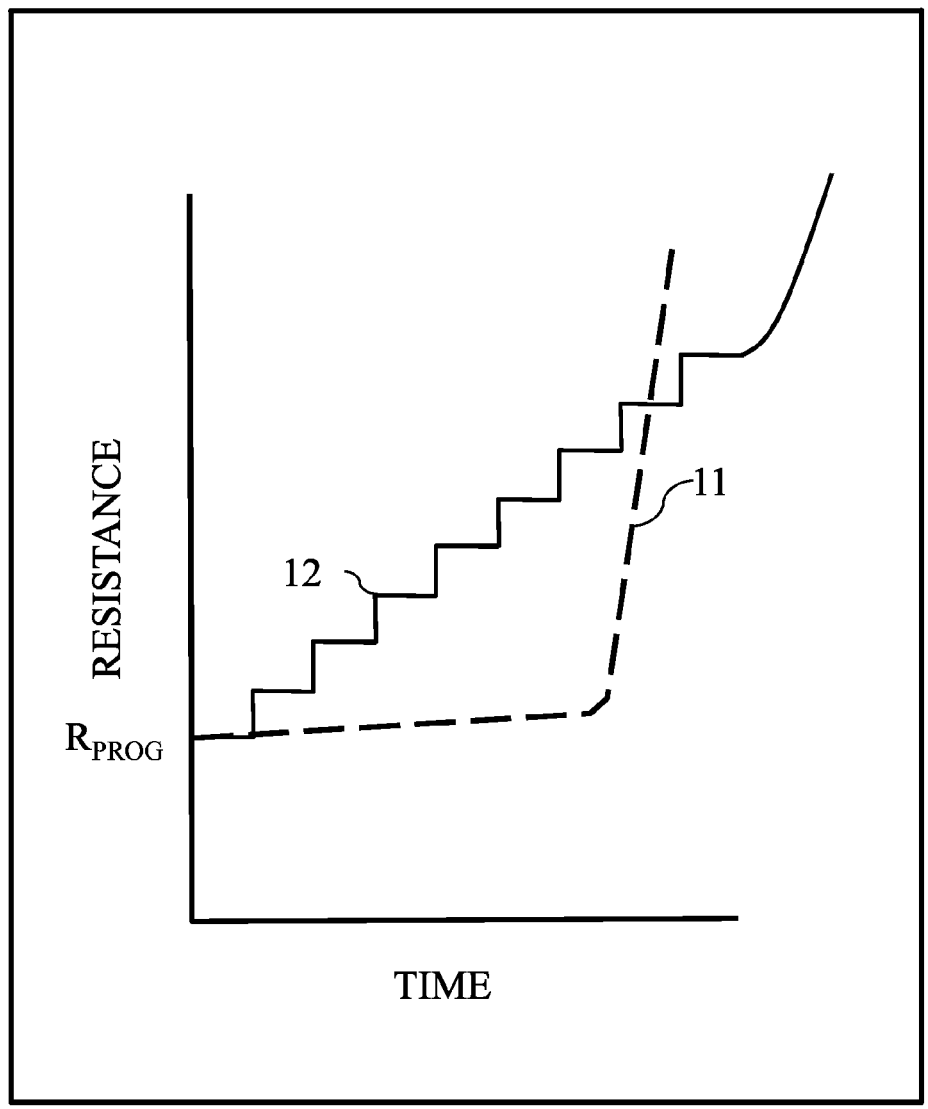
FIG. 4 illustrates the evolution of resistance of a resistive memory unit when subjected to an erase voltage stress as identified by the inventors.

FIG. 4 illustrates the evolution of resistance of a memory unit when subjected to an erase voltage stress as identified by the inventors.

In general, during the erase process, the resistance of the memory unit increases over a period of time. FIG. 4 illustrates two general type of response of a memory unit when subjected to a negative (erase) voltage. In a first case illustrated by curve 11, the resistance of the memory unit may increase abruptly after a period of slow or negligible increase. After the onset of this abrupt behavior, the resistance of the memory unit increases rapidly within a very short time. Alternatively, in another case illustrated by curve 12, the resistance of the memory unit may increase gradually.

As also illustrated in FIG. 4, the onset of the abrupt behavior for the curve 11 may be faster or earlier than the onset of the abrupt behavior for the curve 12. Consequently, an abruptly erasing memory unit may result in improper operation of the memory unit. This is because the onset of the abrupt behavior may vary across the memory cell. In particular, the time to erase abruptly may be different across different memory units in the memory cell. In contrast, curve 12 illustrates a controlled behavior in which the final resistance of the memory unit after the erase process may be controlled by the time of the erase process. Further, curve 12 may be more repetitive, i.e., adjacent memory units in the memory cell array may have similar resistance versus erase time response.

Figure 5A:
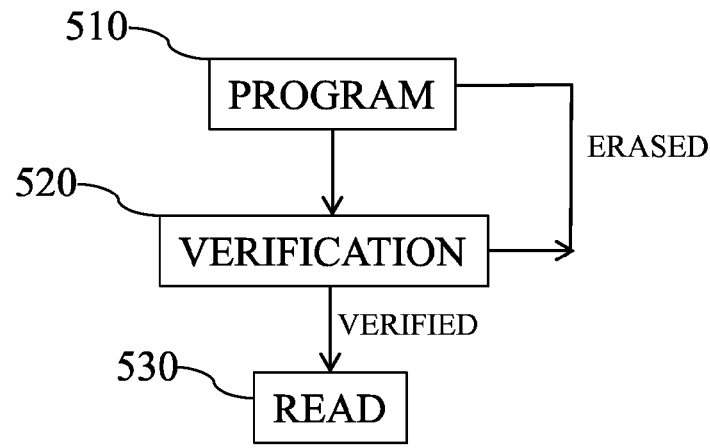
Figure 5B:
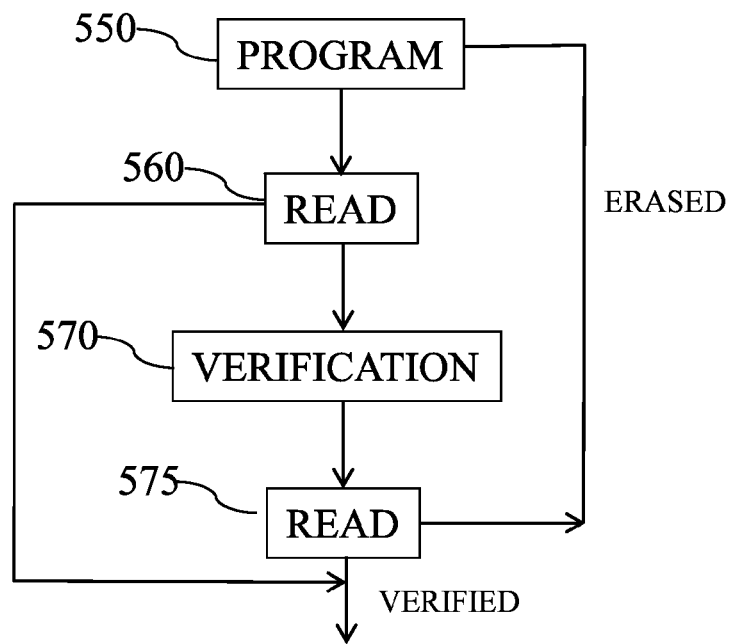
Figure 5D:
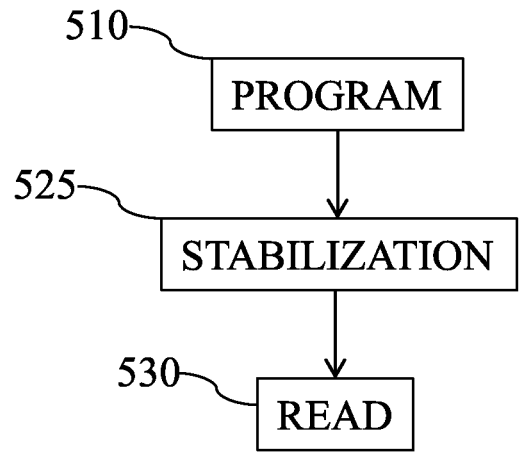
Figure 5C:
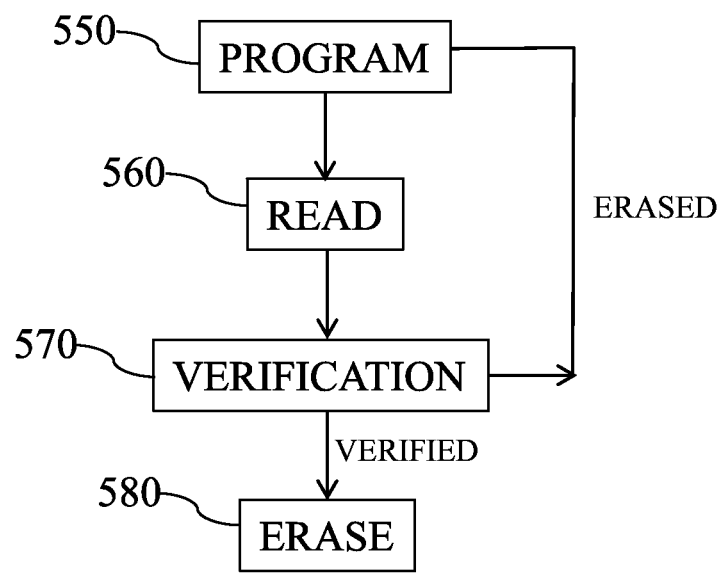

FIG. 5, which includes FIGS. 5A-5D, illustrates a method of operating a memory cell in accordance with embodiments of the present invention. FIGS. 5A and 5B illustrate a post program operation while FIG. 5C illustrates a pre-erase operation in accordance with embodiments of the invention, and wherein FIG. 5D illustrates a verification/stabilization operation without feedback.

Referring to FIG. 5A, the operation of the memory cell includes a program operation 510 as in conventional memory cells. The program operation 510 results in forming a low resistance state. However, embodiments of the present invention include a verification operation 520. The verification operation may be intended to verify that the memory unit is programmed into a stable low resistance state. For example, if the memory unit is not programmed into a stable low resistance state, the verification operation may erase the state of the memory unit. As a consequence, the erased memory unit is reprogrammed. The verification operation 520 may be performed again after the programming until the resistive memory unit is programmed to a stable state.

In contrast, if the verification operation finds that the memory unit is programmed into a stable low resistance state, further operations of the memory unit may proceed as in a normal operation of the memory cell. For example, a read operation 530 may be performed followed by an erase operation.

FIG. 5B illustrates an alternative embodiment of the memory cell in which a verification operation may be performed between read operations. As illustrated in FIG. 5B, after one or more program operations 550, a read operation 560 is performed. The read operation 560 indicates the integrity of the program operation. If the read operation indicates that the memory unit is not programmed into a stable low resistance state, a verification operation 570 is performed by applying a negative verification voltage, which is above the erase voltage as described in various embodiments. In contrast, if the read operation 560 finds that the memory unit is programmed into a low resistance state, further operations of the memory unit may proceed as in a normal operation of the memory cell. After the verification operation 570, another read operation 575 may be performed to ascertain the memory unit is in a low resistance state. If the memory unit has been erased due to the application of the verification operation 570, the read operation 575 indicates that the memory unit is not in a low resistance state. In such a case, the memory unit is programmed again. This sequence is repeated until a stable low resistance state is formed within the memory unit.

FIG. 5C illustrates an alternative embodiments of the memory cell in which a verification operation may be performed prior to an erase operation. In this embodiment, the program operation 550 and read operation 560 may proceed as in a conventional operation. Next, a verification operation 570 may be performed after which the memory unit is either erased or maintains the programmed state. If the memory unit is erased due to the verification operation 570, the memory unit is reprogrammed. The verification operation 570 may be performed again after the programming until the resistive memory unit is programmed to a stable state.

FIG. 5D illustrates a verification/stabilization operation without feedback. For example, a stabilization operation 525 may be performed after a program operation 510. The stabilization operation 525 may be used to stabilize a low resistance state of the memory unit.

In various embodiments of FIG. 5, the verification operation is performed by applying a verification voltage across the memory unit. The verification voltage is intended to fix or amend defective conductive paths, for example, as described with respect to FIGS. 3A and 3C. In various embodiments, the verification voltage is lower than the erase voltage of the memory unit. Therefore, memory units that are programmed into a stable conductive path, for example, as illustrated in FIG. 2A do not have any significant change in resistance due to the application of the verification voltage. Memory units that are programmed with some defects may realign as further illustrated in FIG. 6. Further, some memory units that are programmed weakly may be erased completely by the application of the verification voltage. When the verification operation reforms the conductive path of the memory unit or has no impact on the conductive path of the memory unit, no further action is taken and further operation of the memory unit continues as in normal operation. In contrast, if the verification operation results in erasing the conductive path of the memory unit, then the memory unit is reprogrammed.

Figure 6A:
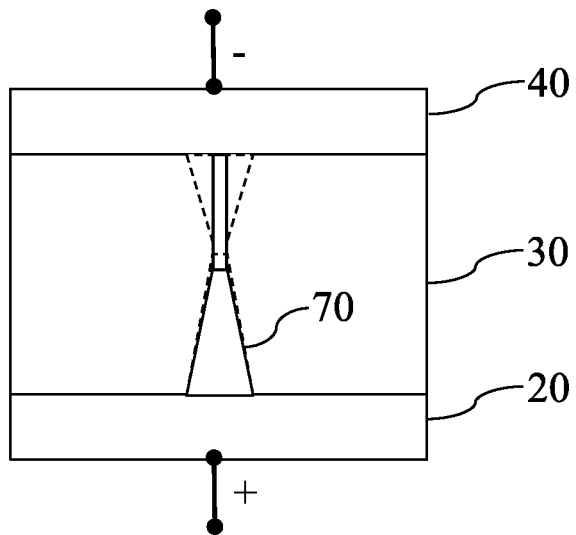
FIGS. 6A and 6B, illustrates a memory unit after a verification operation in accordance with an embodiment of the present invention.
Figure 6B:
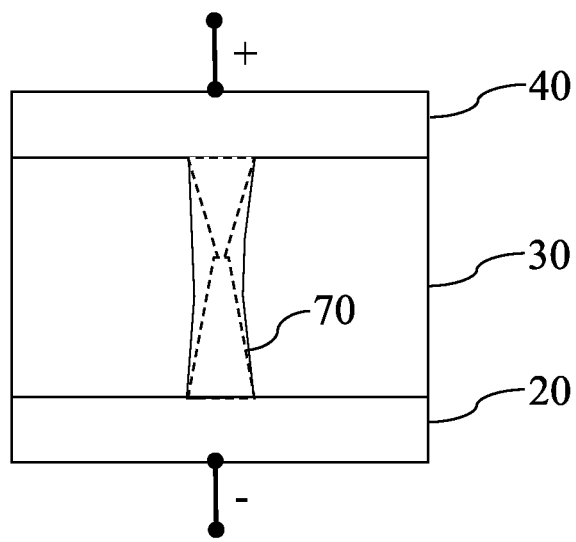

FIG. 6, which includes FIGS. 6A and 6B, illustrates a schematic of a memory unit after a verification or stabilization operation in accordance with embodiments of the present invention.

This embodiment illustrates a potential benefit of applying a verification or stabilization voltage to a memory unit programmed with a defective conductive path (e.g., FIGS. 3A and 3C).

As illustrated in FIG. 6A, memory units that are programmed with defective conductive paths 70 may be reformed due to realignment of the conductive atoms (dashed lines indicating prior shape of the conductive path 70) when subjected to a verification voltage. In the illustrated embodiment, the verification voltage is negative and therefore, the total number of conductive atoms in the variable resistance layer 30 remains constant during the verification operation.

FIG. 6B illustrates an alternative embodiment using additional conductive atoms to reform the defective conductive path. As illustrated in FIG. 6B, when a positive voltage is used during verification and/or stabilization operation, conductive atoms from the second conductive layer 40 migrate into the variable resistance layer 30. These conductive atoms are added to the existing conductive path at a low voltage, which enhances the possibility of removing the defective regions.

Figure 7B:
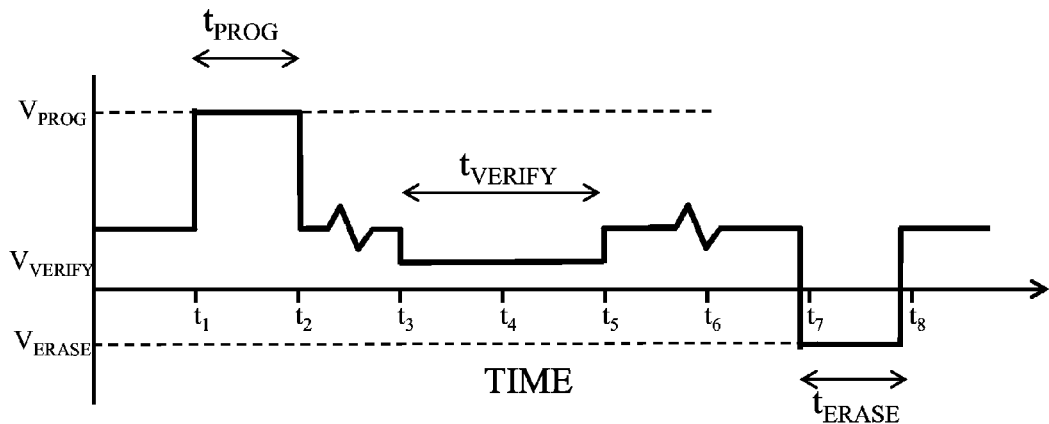
Figure 7A:
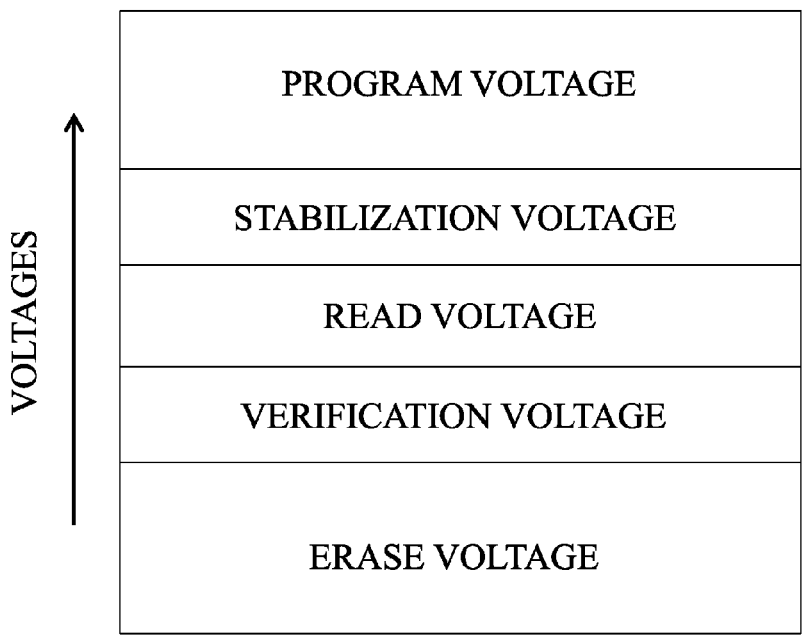
Figure 7C:
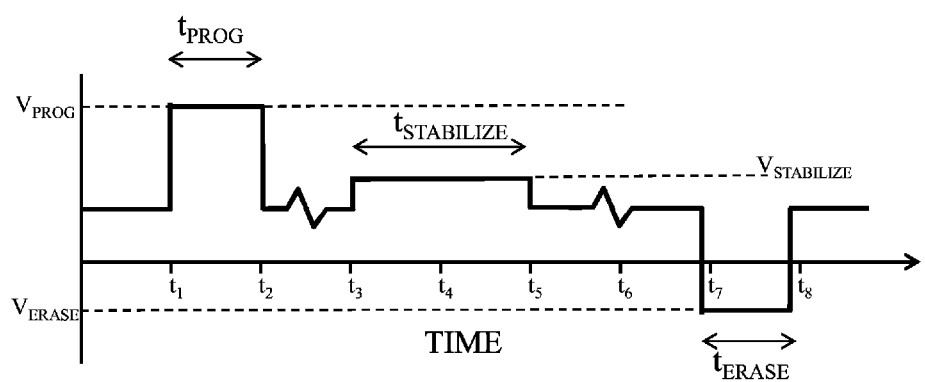

FIG. 7, which includes FIGS. 7A-7C, illustrates voltages used in operation of the memory unit. FIG. 7A illustrates the relative positioning of the verification voltage while FIGS. 7B and 7C illustrate examples of the programming, verification, and erase pulses.

Referring to FIG. 7A, the verification voltage may be lower than the read voltage but lower than a typical threshold voltage for erasing the memory unit. The threshold voltage for erasing a defective memory unit may be much lower than this typical threshold voltage. In this embodiment, the verification voltage is a negative voltage similar to the erase voltage. Therefore, the verification operation does not add new conductive atoms. The verification operation may reform the conductive path as illustrated in FIG. 6 using this embodiment.

In an alternative embodiment, the verification or stabilization voltage may be higher than the read voltage but lower than a typical threshold voltage for programming. For example, in this embodiment, the verification or stabilization voltage is a positive voltage similar to the programming voltage. Therefore, in this embodiment, the verification or stabilization operation may add new conductive atoms to the conductive path removing the defective structure and/or defects of the conductive path.

For example, the programming voltage may have a potential $V_{PROG}$ of about 1 V to about 1.5V, the read voltage is negligible (typically about −200 mV to about 200 mV) and does not change the state of the memory cell. In one embodiment, the erase voltage may have a potential $V_{ERASE}$ less than about −200 mV (more negative), for example, about −1V to −2V. In various embodiments, the verification voltage may be about −200 mV to about −800 mV, and about −500 mV in one embodiment. Alternatively, in another embodiment, the verification or stabilization voltage may be about 200 mV to about 800 mV, and about 500 mV in one embodiment FIG. 7B illustrates a program pulse applying a program voltage $V_{PROG}$ followed by a verification pulse applying a negative verification voltage $V_{VERIFY}$, and a erase pulse applying a erase voltage $V_{ERASE}$. As illustrated, the time period of the program pulse $V_{PROG}$ and time period of the erase pulse $t_{ERASE}$ may be smaller than the time period of the verification pulse $t_{VERIFY}$. In various embodiments, the time period of the verification pulse $t_{VERIFY}$ may be longer than 50 µs, and about 100 µs in one embodiment. In various embodiments, the time period of the verification pulse $t_{VERIFY}$ may be about 50 µs to about 150 µs. In contrast, the time period of the erase pulse $t_{ERASE}$ may be ten times less, for example, about 10 µs or less.

FIG. 7C illustrates a program pulse applying a program voltage $V_{PROG}$ followed by a verification pulse applying a positive verification or stabilization voltage $V_{STABILIZE}$, and a erase pulse applying a erase voltage $V_{ERASE}$. As illustrated, the time period of the program pulse $t_{PROG}$ and time period of the erase pulse $t_{ERASE}$ may be smaller than the time period of the stabilization pulse $t_{STABILIZE}$. In various embodiments, the time period of the stabilization pulse $t_{STABILIZE}$ may be longer than 50 µs, and about 100 µs in one embodiment. In various embodiments, the time period of the stabilization pulse $t_{STABILIZE}$ may be about 50 µs to about 150 µs. In contrast, the time period of the program pulse $t_{PROG}$ may be ten times less, for example, about 10 µs or less.

Thus, in various embodiments, a lower potential is applied over a longer time period, which may enable the memory unit to reach a more stable state.

Figure 8A:
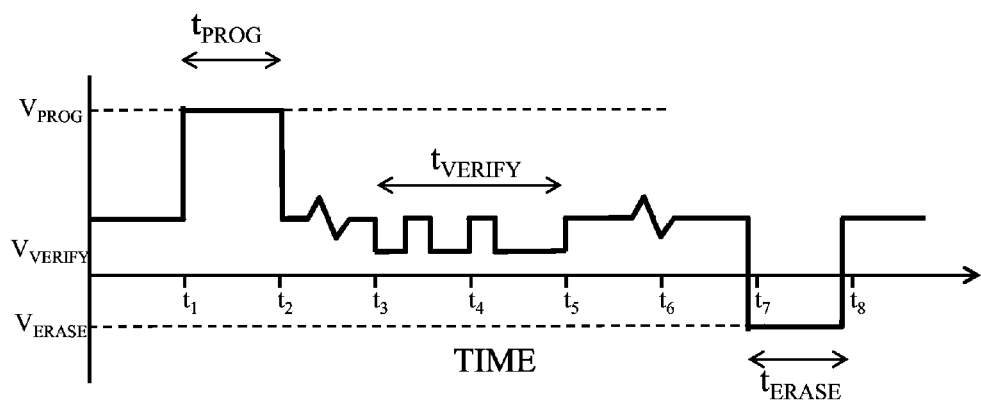
FIGS. 8A-8C, illustrates further examples of the programming, verification, and erase pulses.
Figure 8B:
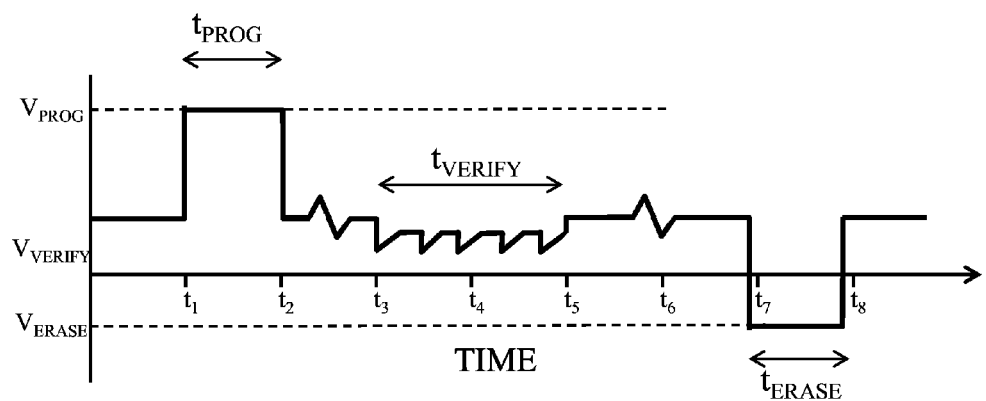
Figure 8C:
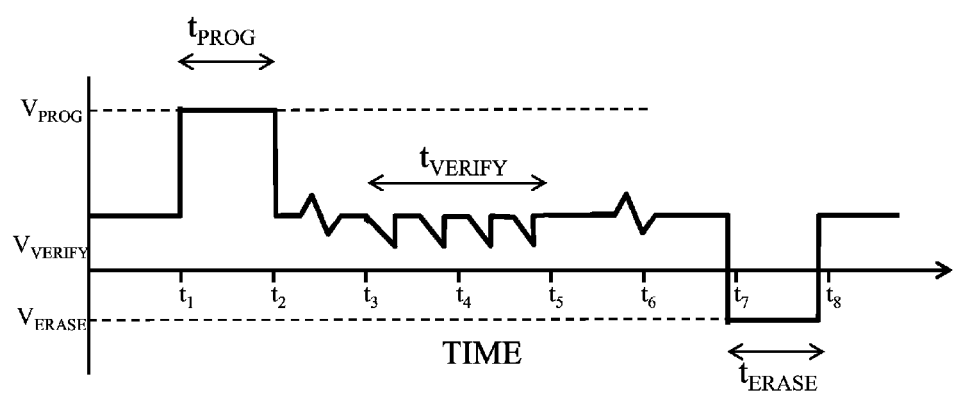

FIG. 8, which includes FIGS. 8A-8C, illustrates further examples of the programming, verification, and erase pulses.

In various embodiments, the verification or stabilization voltages may be applied using different types of pulse characteristics. For example, a plurality of pulses may be used in one or more embodiments. In other words, multiple pulses may be repeated during the verification or stabilization step. The pulses may have different characteristics in various embodiments. For example, FIG. 8A illustrates a plurality of square pulses. In contrast, FIG. 8B, illustrates a triangular pulse having a ramp in one direction. FIG. 8C illustrates a different type of triangular pulse having a ramp up and a ramp down characteristic. In other embodiments, the verification or stabilization pulse may have exponential, parabolic ramp up and/or ramp down profiles. The ramp up or ramp down profiles may be applied to a single pulse or to a plurality of pulses in various embodiments. In some embodiments, the time period of the ramps or the duration of the peak verification or stabilization voltage may be different between adjacent pulses in the plurality of pulses (e.g., FIG. 8A). Although not illustrated specifically, the stabilization profile illustrated in FIG. 7C may also include similar characteristics such as ramp up, ramp down, peak time variation, and others discussed using FIG. 8.

Figure 9A:
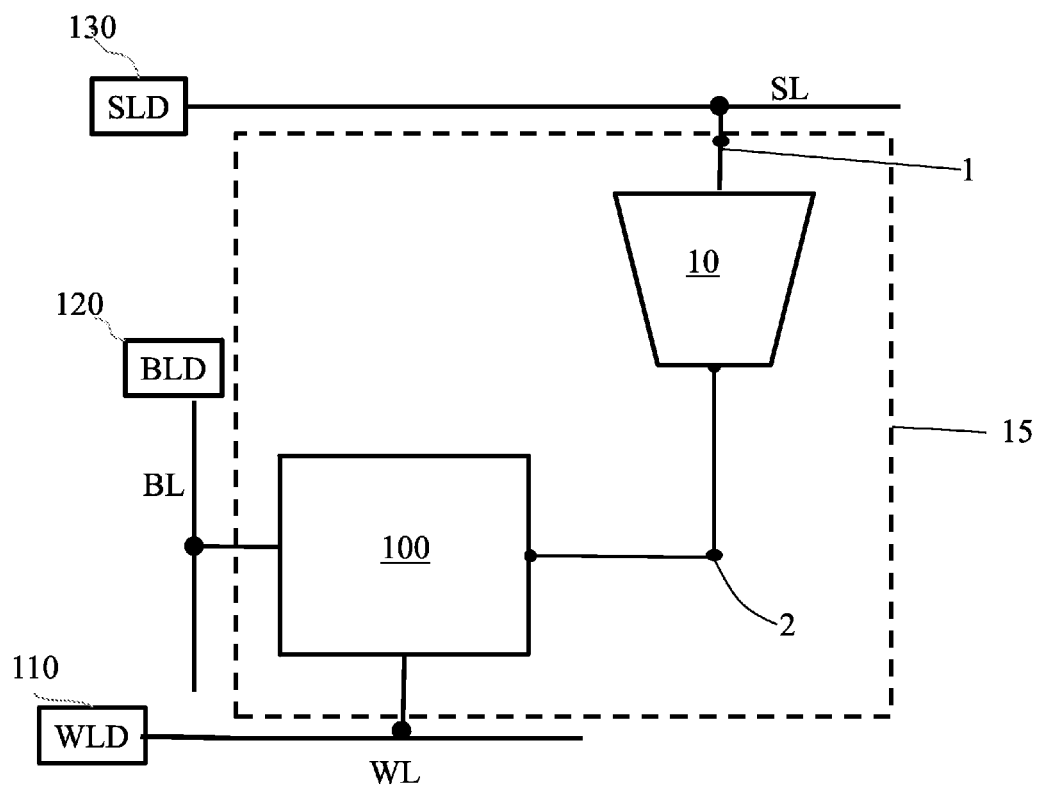
FIGS. 9A-9B, illustrates a memory cell implementing embodiments of the invention.
Figure 9B:
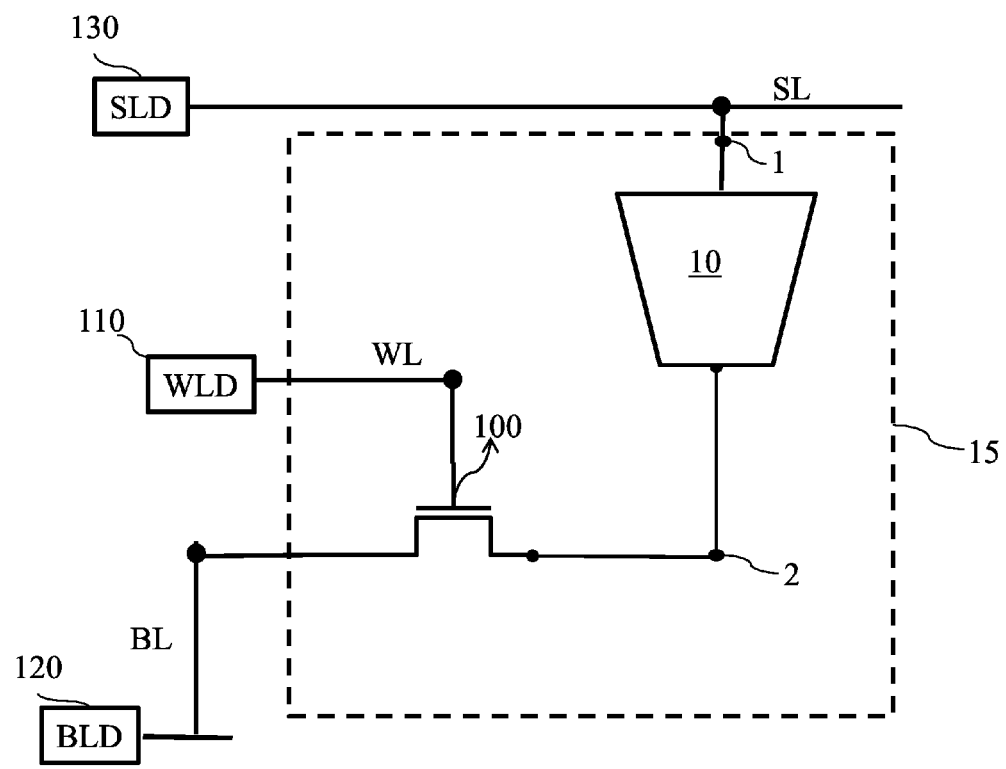

FIG. 9, which includes FIGS. 9A-9B, illustrates a memory cell in accordance with embodiments of the invention.

The memory cell 15 may be a one access device and one memory unit (1-AD 1-MU) memory cell in one embodiment. The memory cell 15 may be connected through word lines WL, bit lines BL, and select lines SL to plurality of similar memory cells thereby forming a memory array. A memory cell 15 comprises the memory unit 10 described in various embodiments of the present application. The memory unit 10 may comprise resistive switching memories that switch based on thermal, electrical, and/or electromagnetic effects.

The memory unit 10 may comprise an ionic memory in one or more embodiments. Such ionic memory may involve cells based on anion migration or cation migration. An example of an ionic memory includes a conductive bridging random access memory. The CBRAM may comprise a solid electrolyte layer sandwiched between an inert electrode and an electro-chemically active electrode. The solid electrolyte layer may comprise a chalcogenide material such as a germanium based chalcogenide such as $GeS_2$. In various embodiments, the solid electrolyte layer may comprise copper doped $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}S$, $TiO_2$, $ZrO_2$, $SiO_2$. In some embodiments, the solid electrolyte 60 may comprise a plurality of layers and may include bilayers such as $Ge_xSe_y/SiO_x$, $Ge_xSe_y/Ta_2O_5$, $Cu_xS/Cu_xO$, $Cu_xS/SiO_2$ and combinations thereof. The electro-chemically active electrode may comprise silver, copper, zinc, and/or copper-tellurium in various embodiments.

In another embodiment, the memory unit 10 may comprise a RRAM, e.g., based on metal oxides in some embodiments. The memory unit 10 may comprise a phase change memory unit in alternative embodiments.

Referring to FIG. 9A, the memory unit 10 is disposed between a first node 1 (e.g., anode) and a second node 2 (e.g., cathode). The first node 1 is coupled to the select line SL while the second node 2 is coupled to a bit line BL through an access device 100.

In various embodiments, the access device 100 may comprise a switching device. In one embodiment, the access device 100 is a diode. In an alternate embodiment, the access device 100 is a transistor. The access device 100 may provide a conductive path from the second node 2 to the bit line BL. The access device 100 may be enabled or controlled using the word line WL (as well as the bit line BL and the select line SL). The word line WL may be coupled to a word line driver (WLD) 110, which may be commonly shared with a plurality of memory cells sharing a common word line WL. As will be described, the WLD 110 may drive the word line using one or more of the potential pulse profiles described in various embodiments.

Similarly, the bit line BL may be coupled or driven by a bit line driver BLD 120 and the select line SL may be coupled to a select line driver SLD 130. The BLD 120 and the SLD 130 may be commonly shared over a plurality of memory cells sharing a common bit line or a common select line. As will be described, the BLD 120 and/or the SLD 130 may drive the bit line and select line respectively using one or more of the pulse profiles described in various embodiments.

FIG. 9B illustrates a memory cell comprising a transistor and a memory unit in accordance with an embodiment of the invention.

In this embodiment, the access device 100 is a transistor. The transistor may be a metal insulator field effect transistor in one embodiment. In other embodiments, the transistor may be other types of transistors including bipolar transistors. The memory cell 15 may be a one transistor and one memory unit (1-T 1-MU) memory cell in one embodiment. As illustrated in FIG. 9B, the gate of the access device 100 is coupled to a word line WL. A first source/drain node of the access device 100 is coupled to a bit line BL while a second source/drain node of the access device 100 is coupled to the memory unit through the second node 2. Thus, the memory unit 10 is coupled to the bit line BL through a channel region of the access device 100.

Figure 10A:
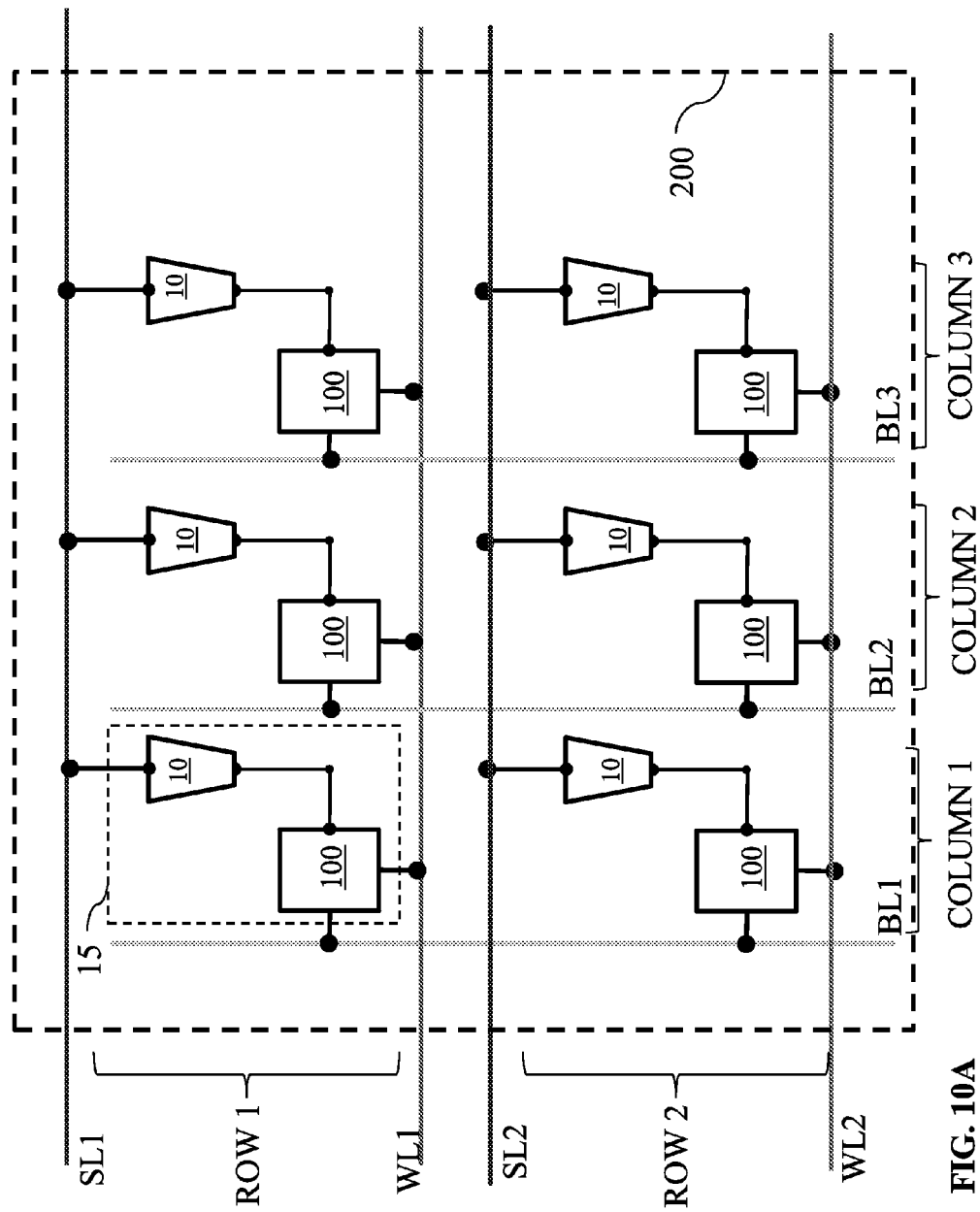
FIGS. 10A and 10B, illustrates various memory cell array implementing embodiments of the invention.
Figure 10B:
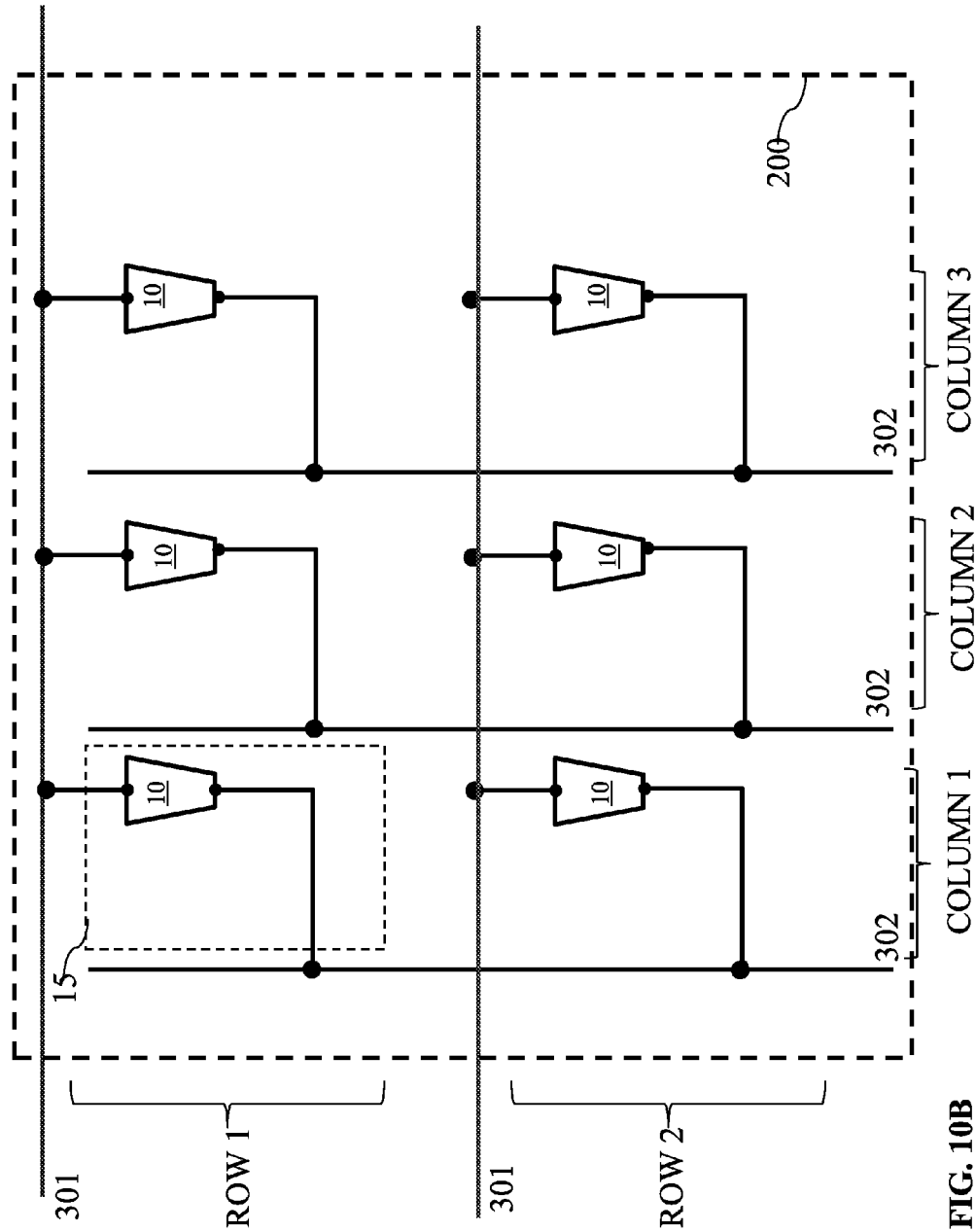

FIG. 10, which includes FIGS. 10A and 10B, illustrates various memory cell array implementing embodiments of the invention.

A memory cell array 200 may be formed using the memory unit 10 implementing the various embodiments described above. The memory unit 10 may be formed as described in FIG. 9.

In one embodiment illustrated in FIG. 10A, a memory cell array 200 may be formed from the memory cell 15 comprising an access device 100 and a memory unit 10 as described previously with respect to FIG. 9.

In an alternative embodiment illustrated in FIG. 10B, the memory cell array 200 may be implemented as a cross-point memory array, for example, as a stacked memory array. The memory unit 10 may include a switching device, e.g., a diode, and a resistor within the same device in one such embodiment. Such arrays may also be used to form logic devices in some embodiments. The memory unit 10 is coupled between a first plurality of lines 301 and a second plurality of lines 302. The first and the second plurality of lines 301 and 302 may be perpendicular to each other. The memory unit 10 may be coupled to a first line of the first plurality of lines 301 in a first metal level to a first line of the second plurality of lines 302 in a metal level vertically above or below the first metal level.

Figure 11A:
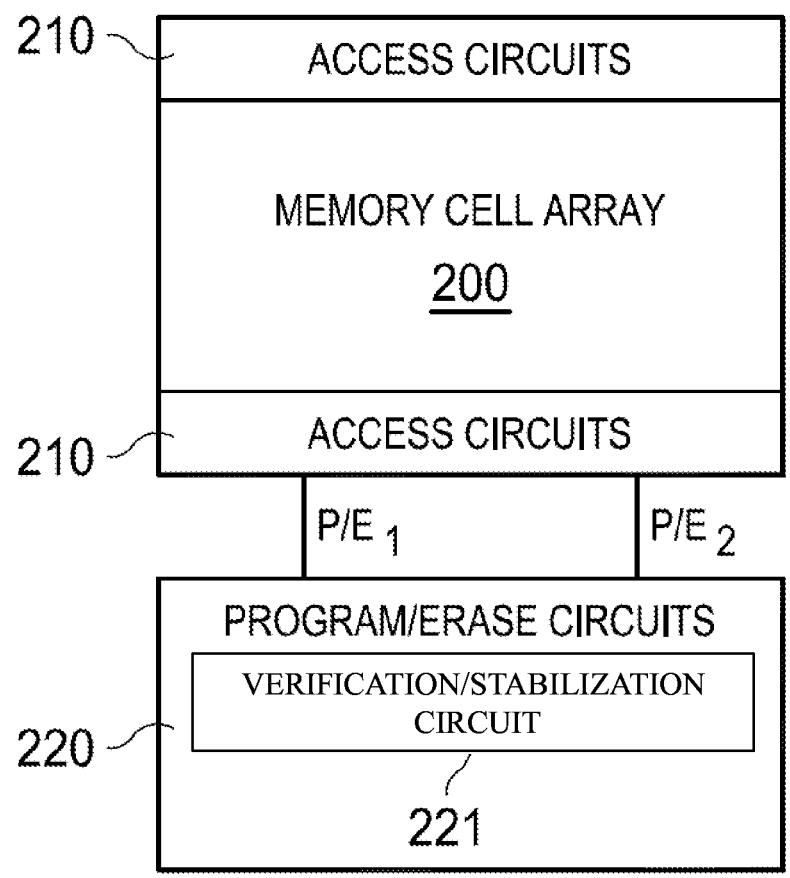
FIGS. 11A-11B, illustrates a memory device implementing embodiments of the invention.
Figure 11B:
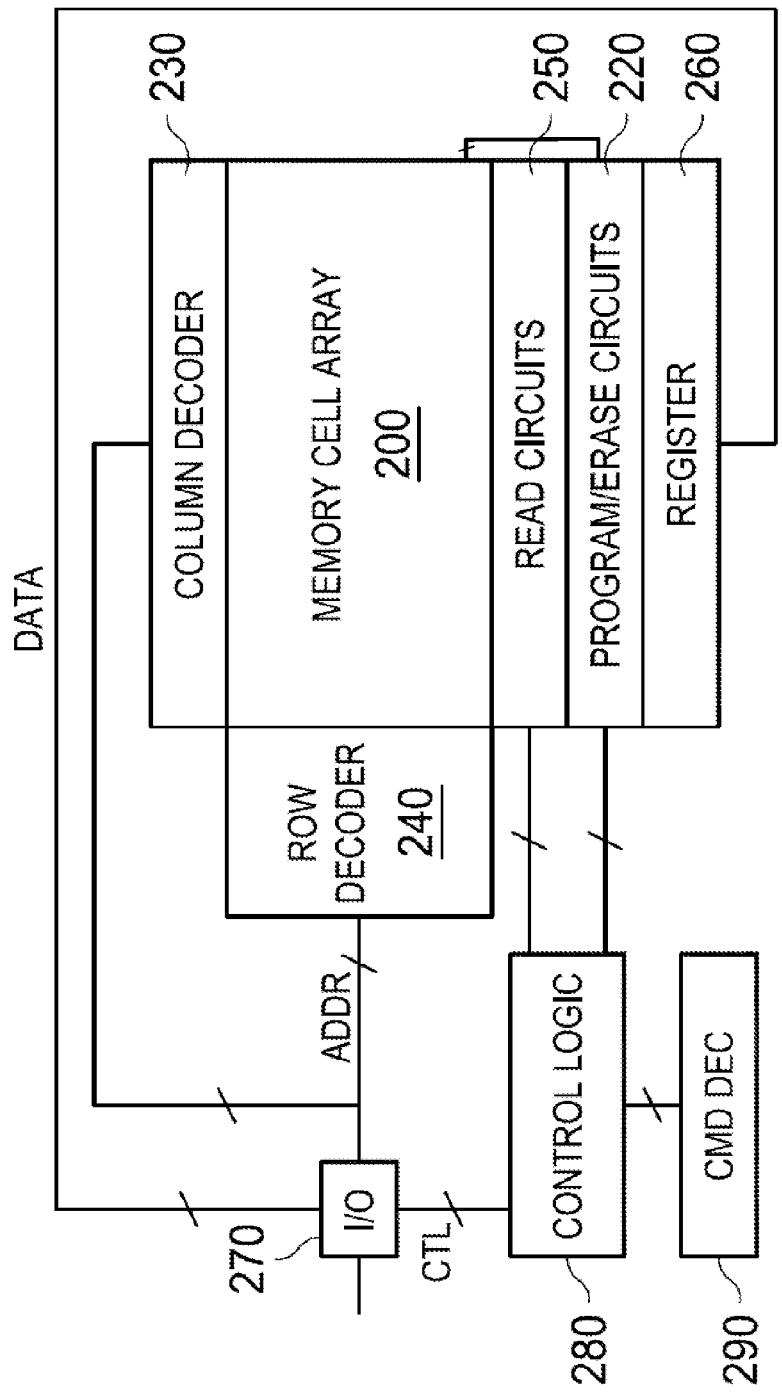

FIG. 11, which includes FIGS. 11A-11B, illustrates a memory device implementing embodiments of the invention.

Referring to FIG. 11A, the memory device comprises a memory cell array 200 (e.g., as described in FIG. 10), access circuits 210, and program/erase circuits 220. The memory cell array 200 may comprise a plurality of memory units 10 as described previously. The access circuits 210 provide electrical connections to the memory cell array 200 so that the memory units 10 may be programmed, erased, and read. The access circuits 210 may be located on one or more sides of the memory cell array 200. For example, the access circuits 210 may be located on opposite sides such that the potential may be applied across the memory units. The access circuits 210 may comprise the word line, bit line, and select line drivers described in FIG. 9 as an example.

The program and erase circuits 220 may provide program and erase signals (e.g., $P/E_1$, $P/E_2$) to the access circuits 210, which applies them to the memory cell array 200. The program and erase signals may comprise external or internal circuits to enable generation of the voltage pulses. In one embodiment, the program and erase circuits 220 comprises a verification circuit 221 for generating the verification and/or stabilization voltage pulses. The verification circuit 221 may comprise pulse, function, or signal generators. In one embodiment, the verification circuit 221 comprises a comparator to cut-off the current source when a predetermined voltage is achieved. In various embodiments, the verification circuit 221 may comprise any suitable circuits known to a person having ordinary skill in the art. In some embodiments, a current mirror circuit may be used to dynamically maintain a maximum current passing through the memory unit.

The peak program or erase voltage may be higher than or lower than a supply voltage. The program and erase circuits may include charge pump circuits for generating higher than supply voltages, or step down voltage regulators and the like generating lower than supply voltages. The program and erase circuits may also receive one or more of the program and erase signals from an external circuit in some embodiments. In some embodiments, the program and erase circuits may comprise program circuits physically separate from the erase circuits.

FIG. 11B illustrates a further embodiment of the memory device. The memory device includes the program and erase circuits 220 and memory cell array 200 as described in FIG. 10A. The access circuits may include a column decoder 230 and a row decoder 240. In response to an address data, the column and the row decoders 230 and 240 may select group of memory cells for reading, programming, erasing. Further, the memory device may comprise read circuits 250 separate from the program and erase circuits 220. The read circuits 250 may include current and/or voltage sense amplifiers. The memory device may further include a register 260 for storing read data values from the memory cell array 200 or to store data to be written into the memory cell array 200. In various embodiments, the register 260 may input and output data in parallel (i.e., bytes, words, and others). In some embodiments, the register 260 may be accessed by serial data paths.

Input/output (I/O) circuits 270 may receive address values and write data values, and output read data values. The received address values may be applied to column and row decoders 230 and 240 to select memory cells. Read data from the register 260 may be output over the I/O circuits 270. Similarly, write data on I/O circuits 270 may be stored in registers 260. A command decoder 290 may receive command data, which may be passed on to the control logic 280. The control logic 280 may provide signals to control various circuits of the memory device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2-11 may be combined with each in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of operating a resistive switching device, the method comprising:
    applying a program stress to a two terminal resistive memory unit, the program stress being applied at a program voltage configured to change a state of the memory unit from a first state to a second state;
    applying a verification/stabilization stress to the two terminal resistive memory unit, the verification/stabilization stress being applied at a verification/stabilization voltage; and
    applying an erase stress to the two terminal resistive memory unit, the erase stress being applied at an erase voltage configured to change a state of the memory unit from the second state to the first state, wherein the verification/stabilization voltage is between the program voltage and the erase voltage.

2. The method of claim 1, further comprising:
    detecting the state of the two terminal resistive memory unit after applying the verification/stabilization stress; and
    applying the program stress if the two terminal resistive memory unit is in the first state.

3. The method of claim 2, further comprising:
    repeating the steps of applying the verification stress and detecting the state until the two terminal resistive memory unit is in the second state after the detecting.

4. The method of claim 1, further comprising:
    applying a read stress to the two terminal resistive memory unit, the read stress being applied at a read voltage between the verification/stabilization voltage and the program voltage.

5. The method of claim 4, wherein the read stress is applied after applying the program stress but before applying the verification/stabilization stress.

6. The method of claim 1, wherein applying a verification/stabilization stress comprises applying only a single pulse.

7. The method of claim 1, wherein applying a verification/stabilization stress comprises applying a single pulse multiple times.

8. The method of claim 1, wherein the first state is a low resistance state and wherein the second state is a high resistance state.

9. The method of claim 1, wherein the erase voltage is applied for a shorter time than the verification/stabilization voltage.

10. The method of claim 1, wherein the verification stress is positive.

11. The method of claim 1, wherein the verification stress is negative.

12. A method of operating a resistive switching device, the method comprising:
    applying a program stress to a two terminal resistive memory unit, the program stress being applied at a program voltage configured to change a state of the memory unit from a first state to a second state;
    after applying the program stress, applying a read stress to the two terminal resistive memory unit, the read stress being applied at a read voltage; and
    after applying the read stress, applying a verification/stabilization stress to the two terminal resistive memory unit, the verification/stabilization stress being applied at a verification/stabilization voltage, wherein the verification/stabilization voltage is between the read voltage of the two terminal resistive memory unit and a erase voltage of the two terminal resistive memory unit.

13. The method of claim 12, further comprising:
    applying an erase stress to the two terminal resistive memory unit, the erase stress being applied at an erase voltage configured to change a state of the memory unit from the second state to the first state.

14. The method of claim 13, wherein the erase voltage is applied for a shorter time than the verification/stabilization voltage.

15. The method of claim 12, wherein applying a verification/stabilization stress comprises applying only a single pulse.

16. The method of claim 12, wherein applying a verification/stabilization stress comprises applying a single pulse multiple times.

17. The method of claim 12, wherein the two terminal resistive memory unit comprises an ionic memory.

18. The method of claim 17, wherein the ionic memory comprises conductive bridging memory.

19. The method of claim 12, wherein the two terminal resistive memory unit comprises a metal oxide memory.

20. The method of claim 12, wherein the two terminal resistive memory unit comprises a phase change memory.

21. A semiconductor device comprising:
    a memory cell array comprising an array of two terminal resistive memory units;
    a program circuit configured to program the array of two terminal resistive memory units;

a verification/stabilization circuit configured to apply a verification/stabilization stress on a first memory unit of the memory cell array, the verification/stabilization stress being a voltage between a read voltage of a memory unit of the array of two terminal resistive memory units and a erase or a program voltage of a memory unit of the array of two terminal resistive memory units; and a detection circuit configured to detect a state of the first memory unit.

22. The device of claim 21, wherein the verification/stabilization stress being a voltage between a read voltage of a memory unit of the array of two terminal resistive memory units and a erase voltage of a memory unit of the array of two terminal resistive memory units.

23. The device of claim 21, wherein the verification/stabilization stress being a voltage between a read voltage of a memory unit of the array of two terminal resistive memory units and a program voltage of a memory unit of the array of two terminal resistive memory units.

24. The device of claim 21, wherein each memory unit of the array of two terminal resistive memory units comprises an ionic memory.

25. The device of claim 24, wherein the ionic memory comprises conductive bridging memory.

26. The device of claim 21, wherein each memory unit of the array of two terminal resistive memory units comprises a metal oxide memory.

\* \* \* \* \*